United States Patent
Moriya et al.

(10) Patent No.: US 6,549,147 B1
(45) Date of Patent: Apr. 15, 2003

(54) METHODS, APPARATUSES AND RECORDED MEDIUM FOR REVERSIBLE ENCODING AND DECODING

(75) Inventors: Takehiro Moriya, Tokyo (JP); Naoki Iwakami, Yokohama (JP); Akio Jin, Kokubunji (JP); Takeshi Mori, Tokorozawa (JP); Kazuaki Chikira, Hachioji (JP)

(73) Assignee: Nippon Telegraph and Telephone Corporation, Tokyo (JP)

( * ) Notice: Subject to any disclaimer, the term of this patent is extended or adjusted under 35 U.S.C. 154(b) by 0 days.

(21) Appl. No.: 09/572,789

(22) Filed: May 17, 2000

(30) Foreign Application Priority Data

May 21, 1999 (JP) .............. 11-141653

(51) Int. Cl.[7] .............................. H03M 7/00
(52) U.S. Cl. ...................... 341/50; 341/51
(58) Field of Search ............ 341/67, 50, 51, 341/52, 81, 94, 95, 106; 375/263, 245

(56) References Cited

U.S. PATENT DOCUMENTS

| | | | | |
|---|---|---|---|---|
| 5,537,440 A | * | 7/1996 | Eyuboglu et al. | 375/245 |
| 5,714,950 A | * | 2/1998 | Jeong et al. | 341/67 |
| 5,781,133 A | * | 7/1998 | Tsang | 341/59 |
| 5,809,080 A | * | 9/1998 | Karabed et al. | 375/263 |
| 6,043,763 A | * | 3/2000 | Levine | 341/51 |

FOREIGN PATENT DOCUMENTS

| | | |
|---|---|---|
| JP | 08044399 | 2/1996 |
| JP | 08263096 | 10/1996 |
| JP | 9-252407 A | 9/1997 |

OTHER PUBLICATIONS

Peter Craven, et al. "Lossless Coding for Audio Discs", J. Audio Eng. Soc., vol. 44, No. 9, Sep. 1996. pp. 706–720.

* cited by examiner

Primary Examiner—Peguy Jeanpierre
Assistant Examiner—Joseph Lauture
(74) Attorney, Agent, or Firm—Burns, Doane, Swecker & Mathis L.L.P.

(57) ABSTRACT

An object of the invention is to provide a method for compressing digital input signals at high compression efficiency and reproducing the input data perfectly. The method includes the steps of: converting a digital input signal in each frame to bitstreams according to a sign-magnitude format; deblocking the bitstreams into individual bits; joining each bit in a time sequence while retaining an identical chronological order of bits in all the frames; and reversibly encoding each bitstream obtained by joining the bits. And, the reversible decoding method includes the steps of: reversibly decoding a reversible code sequence in each frame; deblocking the bitstreams obtained by reversible decoding into individual bits; joining each bit in a time sequence while retaining an identical chronological order of bits in all the frames; and joining successive frames obtained by joining the bits.

38 Claims, 13 Drawing Sheets

FIG. 3

| | TIME 0 | 1 | 2 | 3 | 4 | 5 | 6 | 7 | 8 | 9 | a | b | c | - | 3fd | 3fe | 3ff | NUMBER OF 1S |
|---|---|---|---|---|---|---|---|---|---|---|---|---|---|---|---|---|---|---|
| MSB F | 0 | 0 | 0 | 0 | 0 | 0 | 0 | 0 | 0 | 0 | 0 | 0 | 0 | - | 0 | 0 | 0 | 0 |
| E | 0 | 0 | 0 | 0 | 1 | 0 | 0 | 0 | 0 | 0 | 0 | 0 | 1 | - | 0 | 0 | 0 | 1 |
| D | 0 | 0 | 1 | 0 | 0 | 0 | 1 | 0 | 0 | 0 | 0 | 1 | 0 | - | 0 | 0 | 0 | 7 |
| C | 0 | 0 | 1 | 1 | 0 | 0 | 0 | 0 | 1 | 1 | 0 | 1 | 0 | - | 1 | 0 | 0 | 22 |
| B | 1 | 1 | 0 | 1 | 1 | 0 | 0 | 1 | 1 | 1 | 0 | 0 | 0 | - | 1 | 0 | 0 | 56 |
| A | 0 | 0 | 1 | 0 | 0 | 1 | 0 | 1 | 0 | 1 | 0 | 1 | 1 | - | 0 | 1 | 0 | 233 |
| 9 | 0 | 0 | 0 | 0 | 1 | 0 | 0 | 0 | 1 | 1 | 1 | 1 | 0 | - | 1 | 0 | 0 | 383 |
| 8 | 0 | 0 | 1 | 1 | 1 | 1 | 1 | 0 | 1 | 1 | 0 | 1 | 1 | - | 1 | 1 | 1 | 607 |
| 7 | 0 | 0 | 0 | 0 | 1 | 0 | 0 | 1 | 1 | 1 | 1 | 1 | 1 | - | 0 | 1 | 1 | 581 |
| 6 | 1 | 0 | 1 | 1 | 1 | 1 | 1 | 0 | 0 | 0 | 0 | 1 | 0 | - | 1 | 0 | 1 | 449 |
| 5 | 1 | 0 | 0 | 0 | 0 | 0 | 1 | 1 | 1 | 0 | 1 | 0 | 1 | - | 1 | 1 | 1 | 420 |
| 4 | 0 | 0 | 1 | 1 | 1 | 1 | 1 | 1 | 0 | 1 | 0 | 1 | 1 | - | 0 | 0 | 1 | 544 |
| 3 | 1 | 1 | 0 | 0 | 0 | 0 | 0 | 1 | 1 | 1 | 1 | 1 | 0 | - | 0 | 1 | 1 | 570 |
| 2 | 1 | 0 | 1 | 1 | 0 | 1 | 1 | 1 | 0 | 1 | 1 | 0 | 1 | - | 1 | 0 | 0 | 599 |
| LSB 1 | 0 | 1 | 0 | 0 | 1 | 0 | 0 | 0 | 1 | 1 | 1 | 0 | 0 | - | 0 | 1 | 0 | 607 |
| CODE | 1 | 1 | 1 | 1 | 1 | 1 | 1 | 1 | 0 | 1 | 0 | 1 | 1 | - | 1 | 0 | 1 | 515 |

FIG. 6

| | 0 | 1 | 2 | 3 | 4 | 5 | 6 | 7 | 8 | 9 | a | b | c | - | 3fd | 3fe | 3ff | NUMBER OF 1S |
|---|---|---|---|---|---|---|---|---|---|---|---|---|---|---|---|---|---|---|
| MSB F | 0 | 0 | 0 | 0 | 0 | 0 | 0 | 0 | 0 | 0 | 0 | 0 | 0 | - | 0 | 0 | 0 | 0 |
| E | 0 | 0 | 0 | 0 | 0 | 0 | 0 | 0 | 0 | 0 | 0 | 0 | 0 | - | 0 | 0 | 0 | 0 |
| D | 0 | 0 | 0 | 0 | 0 | 0 | 0 | 0 | 0 | 0 | 0 | 0 | 0 | - | 0 | 0 | 0 | 1 |
| C | 0 | 1 | 1 | 0 | 1 | 1 | 0 | 0 | 0 | 0 | 0 | 0 | 0 | - | 1 | 0 | 0 | 8 |
| B | 0 | 0 | 0 | 0 | 0 | 1 | 1 | 1 | 1 | 1 | 0 | 0 | 0 | - | 1 | 0 | 0 | 30 |
| A | 0 | 0 | 0 | 0 | 0 | 0 | 0 | 0 | 0 | 1 | 1 | 1 | 1 | - | 0 | 0 | 0 | 230 |
| 9 | 0 | 0 | 0 | 0 | 0 | 1 | 1 | 0 | 0 | 0 | 1 | 1 | 1 | - | 0 | 0 | 0 | 350 |
| 8 | 0 | 0 | 1 | 0 | 1 | 0 | 1 | 0 | 1 | 1 | 0 | 1 | 1 | - | 1 | 0 | 1 | 555 |
| 7 | 0 | 1 | 0 | 1 | 0 | 0 | 0 | 1 | 0 | 0 | 1 | 0 | 1 | - | 1 | 1 | 0 | 511 |
| 6 | 0 | 0 | 0 | 0 | 1 | 1 | 0 | 0 | 1 | 1 | 1 | 0 | 1 | - | 1 | 0 | 1 | 389 |
| 5 | 1 | 0 | 0 | 0 | 1 | 0 | 0 | 0 | 0 | 0 | 1 | 0 | 1 | - | 1 | 1 | 1 | 349 |
| 4 | 0 | 0 | 0 | 1 | 1 | 0 | 0 | 1 | 1 | 1 | 0 | 1 | 1 | - | 0 | 0 | 0 | 443 |
| 3 | 1 | 0 | 0 | 1 | 0 | 0 | 0 | 0 | 0 | 1 | 0 | 1 | 0 | - | 0 | 1 | 1 | 445 |
| 2 | 0 | 0 | 0 | 1 | 1 | 1 | 0 | 1 | 1 | 1 | 0 | 1 | 0 | - | 1 | 0 | 1 | 512 |
| LSB 1 | 0 | 0 | 1 | 0 | 0 | 0 | 0 | 1 | 0 | 0 | 1 | 1 | 0 | - | 0 | 1 | 0 | 555 |
| CODE | 1 | 1 | 1 | 1 | 0 | 0 | 0 | 1 | 1 | 0 | 0 | 0 | 1 | - | 0 | 0 | 1 | 459 |

| TIME | 0 | 1 | 2 | 3 | 4 | 5 | 6 | 7 | 8 | 9 | a | b | c | - | 3fd | 3fe | 3ff |

FIG. 10

FILE SIZE (ORCHESTRA, 44.1kHz STEREO)

| | BITSLICE | GZIP | FILE SIZE | MPEG | TOTAL % |
|---|---|---|---|---|---|
| | – | – | 3729[kB] | – | 100 |
| | – | YES | 3233[kB] | – | 86.8 |
| | YES | YES | 2531[kB] | – | 68.0 |
| A | YES | YES | 2055[kB] | 86[kB] | 57.4 |
| | YES | YES | 1786[kB] | 172[kB] | 52.3 |
| | YES | YES | 1609[kB] | 258[kB] | 50.0 |
| | YES | YES | 1487[kB] | 344[kB] | 49.1 |
| | YES | YES | 1401[kB] | 430[kB] | 49.1 |
| | YES | YES | 1336[kB] | 516[kB] | 49.7 |

FILE SIZE (VOCAL, 44.1kHz STEREO)

| | BITSLICE | GZIP | FILE SIZE | MPEG | TOTAL % |
|---|---|---|---|---|---|
| | – | – | 1937[kB] | – | 100 |
| | – | YES | 1687[kB] | – | 87.1 |
| | YES | YES | 1422[kB] | – | 73.4 |
| B | YES | YES | 1200[kB] | 45[kB] | 64.3 |
| | YES | YES | 1075[kB] | 90[kB] | 60.1 |
| | YES | YES | 983[kB] | 135[kB] | 57.7 |
| | YES | YES | 913[kB] | 180[kB] | 56.2 |
| | YES | YES | 862[kB] | 225[kB] | 56.1 |
| | YES | YES | 824[kB] | 270[kB] | 56.5 |

FILE SIZE (POPS, 44.1kHz STEREO)

| | BITSLICE | GZIP | FILE SIZE | MPEG | TOTAL % |
|---|---|---|---|---|---|
| | – | – | 7156[kB] | – | 100 |
| | – | YES | 6135[kB] | – | 85.7 |
| | YES | YES | 5245[kB] | – | 73.4 |
| C | YES | YES | 4669[kB] | 170[kB] | 67.6 |
| | YES | YES | 4458[kB] | 340[kB] | 65.0 |
| | YES | YES | 4347[kB] | 510[kB] | 67.9 |
| | YES | YES | 4273[kB] | 680[kB] | 69.2 |
| | YES | YES | 4223[kB] | 850[kB] | 70.9 |
| | YES | YES | 4189[kB] | 1020[kB] | 72.9 |

FIG. 11

FILE SIZE (ORCHESTRA, 16kHz MONO)

| | BITSLICE | GZIP | FILE SIZE | MPEG | TOTAL % |
|---|---|---|---|---|---|
| | – | – | 676[kB] | – | 100 |
| | – | YES | 576[kB] | – | 85.2 |
| | YES | YES | 493[kB] | – | 72.9 |
| A | YES | YES | 413[kB] | 22[kB] | 64.3 |
| | YES | YES | 367[kB] | 44[kB] | 60.8 |
| | YES | YES | 336[kB] | 66[kB] | 59.5 |
| | YES | YES | 314[kB] | 88[kB] | 59.5 |
| | YES | YES | 297[kB] | 110[kB] | 59.5 |
| | YES | YES | 285[kB] | 132[kB] | 61.7 |

FILE SIZE (VOCAL, 16kHz MONO)

| | BITSLICE | GZIP | FILE SIZE | MPEG | TOTAL % |
|---|---|---|---|---|---|
| | – | – | 352[kB] | – | 100 |
| | – | YES | 308[kB] | – | 87.5 |
| | YES | YES | 274[kB] | – | 77.8 |
| B | YES | YES | 237[kB] | 11[kB] | 70.5 |
| | YES | YES | 220[kB] | 23[kB] | 69.0 |
| | YES | YES | 208[kB] | 34[kB] | 68.8 |
| | YES | YES | 198[kB] | 46[kB] | 68.9 |
| | YES | YES | 188[kB] | 57[kB] | 69.6 |
| | YES | YES | 181[kB] | 69[kB] | 71.0 |

FILE SIZE (POPS, 16kHz MONO)

| | BITSLICE | GZIP | FILE SIZE | MPEG | TOTAL % |
|---|---|---|---|---|---|
| | – | – | 1299[kB] | – | 100 |
| | – | YES | 1117[kB] | – | 86.0 |
| | YES | YES | 978[kB] | – | 75.3 |
| C | YES | YES | 881[kB] | 43[kB] | 71.1 |
| | YES | YES | 840[kB] | 85[kB] | 71.1 |
| | YES | YES | 813[kB] | 128[kB] | 72.4 |
| | YES | YES | 796[kB] | 170[kB] | 74.4 |
| | YES | YES | 782[kB] | 213[kB] | 76.6 |
| | YES | YES | 772[kB] | 255[kB] | 79.1 |

METHODS, APPARATUSES AND RECORDED MEDIUM FOR REVERSIBLE ENCODING AND DECODING

BACKGROUND OF THE INVENTION

1. Field of the Invention

The present invention relates to a method for encoding that requires lesser number of bits to express various digital signals (examples are audio signals such as voice, music and image signals), a method for decoding the coded data and apparatus therefor and a recorded medium containing the application programs therefor.

This invention is based on a Japanese Patent Application, First Publication, Hei 11-141653, the content of which is included herein by reference.

2. Description of the Related Art

Methods for compressing information such as voice and image data include a lossy irreversible compression encoding and lossless reversible compression encoding. Known methods for irreversible compression include various methods based on the standards by International Telecommunications Union-Telecommunication standardization sector (ITU-T) and ISO/IEC MPEG. Such methods are capable of compressing the data to less than ⅟10 of an original size while keeping the loss to a minimum. However, the loss is affected by encoding conditions and input signals, and, depending on the purpose of the work, degradation of the reproduced signal may present a problem. On the other hand, a universal compression encoding often used for compressing computer files and texts is known as a method of reversible compression encoding that can reproduce the original signals perfectly. This method is based on carrying out compression encoding while referring to the statistics of input sequence, and is applicable to any type of signals, and is able to reduce the file size to about ½ of the original text, but when applied directly to voice and image data, the extent of compression efficiency is limited to about 20 percent.

Accordingly, irreversible encoding and reversible encoding have conventionally been used separately depending on the type and purpose of the information to be compression. Therefore, it has been necessary to prepare two types of compression files for one piece of information so that the overall compression efficiency cannot be raised and the known methods have been cumbersome to use.

SUMMARY OF THE INVENTION

It is an object of the present invention to provide an encoding method for lossless compression of digital signals at high compression efficiency, and a decoding method for decoding the signals compressed by the encoding method to reconstruct the original digital signals.

In the present invention, input digital signals are first quantized with a small number of bits by using lossy encoding. Then an error signal (a signal having a reduced magnitude) between the quantized signal and the original digital signal is compressed by using losssless encoding. The feature that distinguishes the present invention from the conventional methods is that by performing such processes, the method ultimately enables to achieve a higher compression ratio without creating any loss, compared with the conventional methods based on applying reversible encoding and irreversible encoding individually to the data to be compressed.

The present invention enables not only to reconstruct the original digital signals perfectly but also to attain a high compression ratio at the same time. And, because the original digital signal is divided in units of frames by using such synchronizing word, the signal can be reproduced perfectly at anywhere in a compressed encoded sequence. It has been a practice in the industry to record both original codes and compressed codes on one CD-ROM, so that the compressed codes can be offered free of charge but the original codes are made available only with payment. In the present invention, both compressed codes and error codes are recorded so that the compressed codes can be offered free of charge to potential customers while paying customers can reproduce the original sound by having both the compressed codes and the error codes. Because the total data volume of the compressed codes and error codes is significantly less than the total data volume of the original sound and compressed codes, it is possible to record the entire data on a recording medium of a smaller capacity. Although the volumes of irreversible and reverse quantization processes are high, such processes can be performed using highspeed commercial hardwares (MPEG encoding/decoding processors, for example) and software that are readily available in the marketplace at low cost. Therefore, the high volume of process is not a serious impediment to applying the present invention.

Accordingly, the present invention, in combination with music compression encoding techniques such as Twin VQ, MP3, MPEG-4, enables effective utilization of both high efficiency irreversible encoding and lossless reversible encoding at the same time. Therefore, the present invention is particularly attractive to music data storage and delivery purposes, and is applicable in a wide range of applications such as network distribution of music data and recorded media for portable audio devices.

BRIEF DESCRIPTION OF THE DRAWINGS

FIG. 3 is an illustration of an example of output from the reordering section 160 in Embodiment 1.

FIG. 6 is an illustration of an example of output from the reordering section 160 in Embodiment 2.

FIG. 10 is a summary of the results of testing in Embodiment 2.

FIG. 11 is a summary of the results of testing in Embodiment 2.

DESCRIPTION OF THE PREFERRED EMBODIMENTS

The following embodiments are meant to be illustrative and do not limit the scope of the invention. Also, it should be noted that combinations of all the features explained in the embodiments may not be necessary in all cases.

Preferred embodiments will be explained in the following with reference to the drawings.

§1. Embodiment 1

Figure 1:
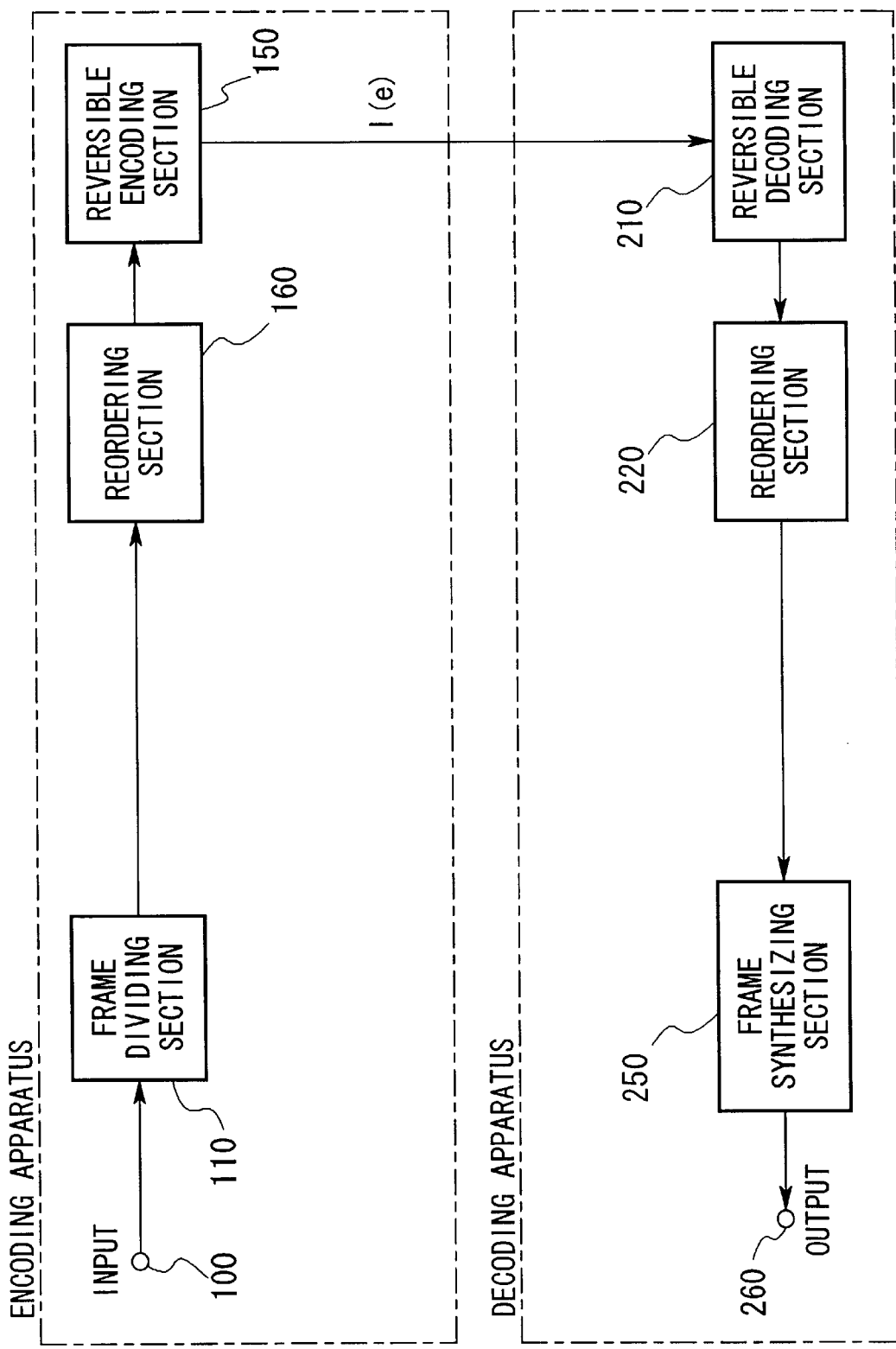
FIG. 1 is a block diagram of an example of the configurations of the encoding and decoding apparatuses in Embodiment 1 of the present invention.

FIG. 1 is a block diagram of an example of the configuration of the encoding and decoding apparatus in Embodiment 1 of the present invention. In the encoding apparatus shown in FIG. 1, time sequence of digital input signals (called a digital input signal sequence) are input from the input terminal 100. A frame dividing section 110 divides the digital input signal sequence successively into units of frames comprised by 1024 digital input signals, for example, that is, 1024 points of samples.

Next, to increase the efficiency of reversible compression encoding carried out by the reversible encoding section 150, the reordering section 160 rearranges the order of bits of the digital input signals (that is, a bitstream) within each frame. Details of the process performed by the reordering section 160 will be explained below.

Figure 2:
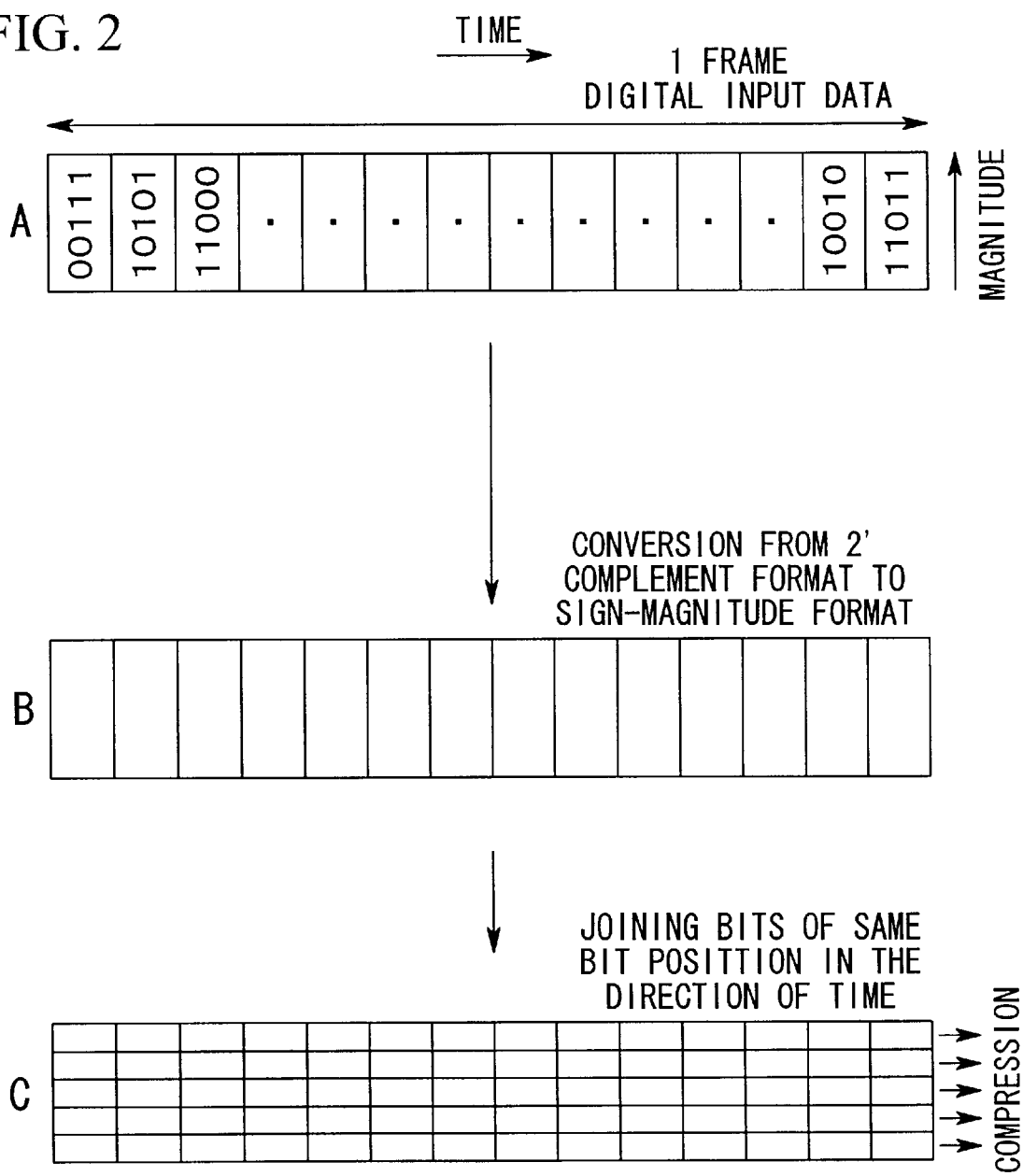
FIG. 2 is an illustration of an example of process performed by the reordering section 160 in Embodiment 1.

FIG. 2 shows an example of the process performed by the reordering section 160 in Embodiment 1. FIG. 2A shows input data (that is, digital input signals within one frame) into the reordering section 160. The magnitude of each digital input signal (in this case, positive or negative integers) is expressed in the 2's complement format.

First, the reordering section 160 converts digital input signals within each frame from bitstreams expressed by the 2's complement format into bitstreams expressed by the sign-magnitude format (refer to FIG. 2B). After the conversion process of the digital input signals, MSB (most significant bit)~2-LSB (second least significant bit) indicate the magnitude of the amplitude, and the LSB indicates the sign of the magnitude.

Next, the reordering section 160 deblocks the converted digital input signals into individual bits. Lastly, the reordering section 160 joins each bit generated by the process of deblocking in the horizontal format for respective bit positions (that is, MSB, 2-MSB, ..., LSB), as shown in FIG. 2C. Moreover, the reordering section 160 may join not all bits generated by deblocking but a part of bits generated by deblocking. And, the reordering section 160 may join bits generated by deblocking not for respective bit positions but for a plurality of bit positions.

FIG. 3 shows an example of the result (referred to as transformed digital input signals) output from the reordering section 160 in Embodiment 1. In FIG. 3, the bitstreams in the horizontal direction (that is, bitstream comprised by 1024 bits belonging to the same bit position) are referred to as horizontal bitstreams.

Next, the reversible encoding section 150 reversibly encodes the output of the reordering section 160. The details of process performed by the reversible encoding section 150 will be explained below.

First, the reversible encoding section 150 encodes horizontal bitstreams from MSB to j-MSB (for example, 4-MSB) individually by following the methods (1)~(4) outlined below.

(1) When all the 1024 bits comprising a horizontal bitstream is "0", this horizontal bitstream is coded "0".

(2) When one bit of the 1024 bits comprising a horizontal bitstream is "1", this horizontal bitstream is coded to a bitstream comprising at the end of "10" a bitstrem (assumed to be 10 bits, as an example) indicateing the bit position of "1".

(3) When two bits of the 1024 bits comprising a horizontal bitstream are "1", this horizontal bitstream is coded to a bitstream comprising at the end of "110" a bitstrem (assumed to be 10 bits×2, as an example) indicateing the bit position of "1".

(4) When more than three bits of the 1024 bits comprising a horizontal bitstream are "1", the horizontal bitstream is attached at the end of "111".

Also, the reversible encoding section 150 encodes individual horizontal bitstreams between (j+1)-MSB to LSB. In this case, the reversible encoding section 150 may encode each horizontal bitstream according to the methods outlined in (1)~(4), or after re-joining each digital input signal (that is, in the vertical direction in FIG. 3), each digital input signal may be encoded using other well known encoding methods.

Further, the reversible encoding section 150 may use encoding methods other than those mentioned above, by using methods applicable to bitstreams containing consecutive sequences or sequences that appear frequently. An example is entropy encoding methods such as Huffman coding or arithmetic encoding. Also, compression efficiency can be improved by applying the universal encoding that enables reversible compression of text and the like to the output of the reordering section 160.

By carrying out the process described above, the encoding apparatus shown in FIG. 1 can output reversible compression codes I (e) from the reversible encoding section.

In contrast, in the decoding apparatus shown in FIG. 1, first, the reversible decoding section 210 decodes the reversible compression codes I (e) by carrying out steps (decoding) opposite to those carried out by the reversible encoding section 150. Next, the reordering section 220 successively outputs digital input signals in units of frames by carrying out steps opposite to those carried out by the reordering section 160. Lastly, the frame synthesizing section 250 reproduces the original digital input signal sequence by successively joining the output of the reordering section 220. By performing all of the processes mentioned above, the digital input signal sequence are output from the output terminal 260.

§2. Embodiment 2

Figure 4:
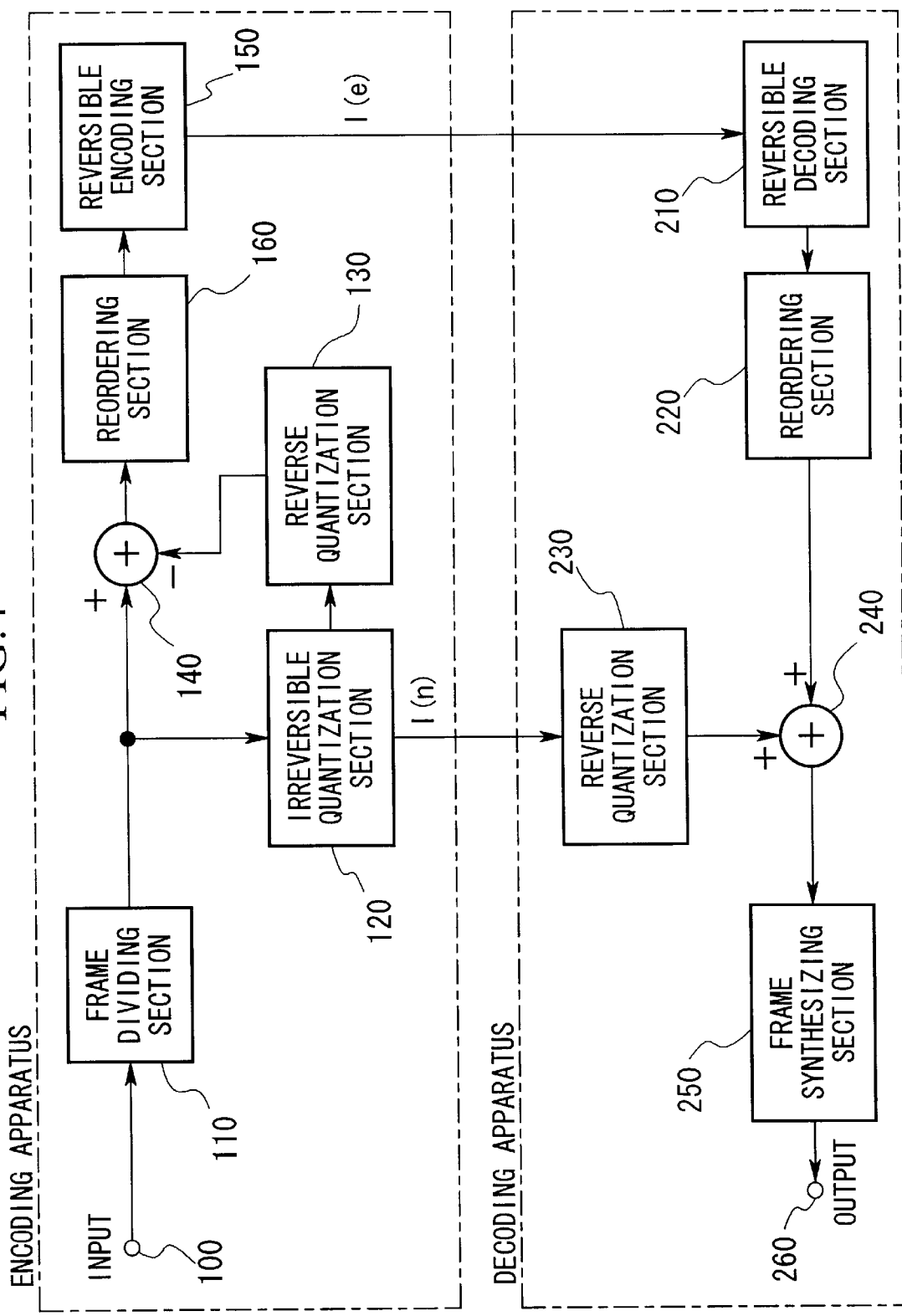
FIG. 4 is a block diagram of an example of the configuration of the encoding and decoding apparatuses in Embodiment 2 of the present invention.

FIG. 4 shows a block diagram of an example of the configuration of the encoding and decoding apparatuses in Embodiment 2 of the present invention. In FIG. 4, those components that correspond to those in FIG. 1 are given the same reference numerals, and their explanations are omitted. In the encoding apparatus shown in FIG. 4, first, the frame dividing section 110 successively divides the digital input signal sequence from the input terminal 100 into units of frames comprised by 1024 pieces of digital input signals (that is, 1024 points of samples) per frame, for example. Next, the irreversible quantization section 120 performs compression encoding of output of the frame dividing section 110. Any suitable method of encoding may be used so long as the method used can restore the original digital input signals to a reasonable degree. For example, any voice encoding technique such as ITU-T may be used if the digital input signals are voice signals, Motion Picture Experts Group (MPEG) or Twin VQ may be used if the data are music signals, and MPEG may be used if the data are image signals. Also, the output from the irreversible quantization section 120 is referred to as irreversible compression codes I (n).

Next, the reverse quantization section 130 having the same construction as the decoder, which corresponds to the irreversible quantization section 120 (that is, reverse quantization section 230), generates local reproduction signals from the irreversible compression codes I (n). Then, the subtraction section 140 obtains an error signal between a local reproduction signal and an original digital input signal. Normally, the magnitude of the error signal is considerably smaller than the magnitude of the original digital input signal. Therefore, it is easier to reversibly compression encode the error signals than to do the digital input signals. And, if the error signals can be reproduced without any loss, then lossless reproduction of original digital input signals is made possible by combining a reversibly compression encoded error signals with an irreversibly compression encoded original digital input signal. Therefore, utilizing this fact (that error signals have small magnitude and easier to reversibly encode), the reversible encoding section 150 reversibly compression encodes the error signals.

Figure 5:
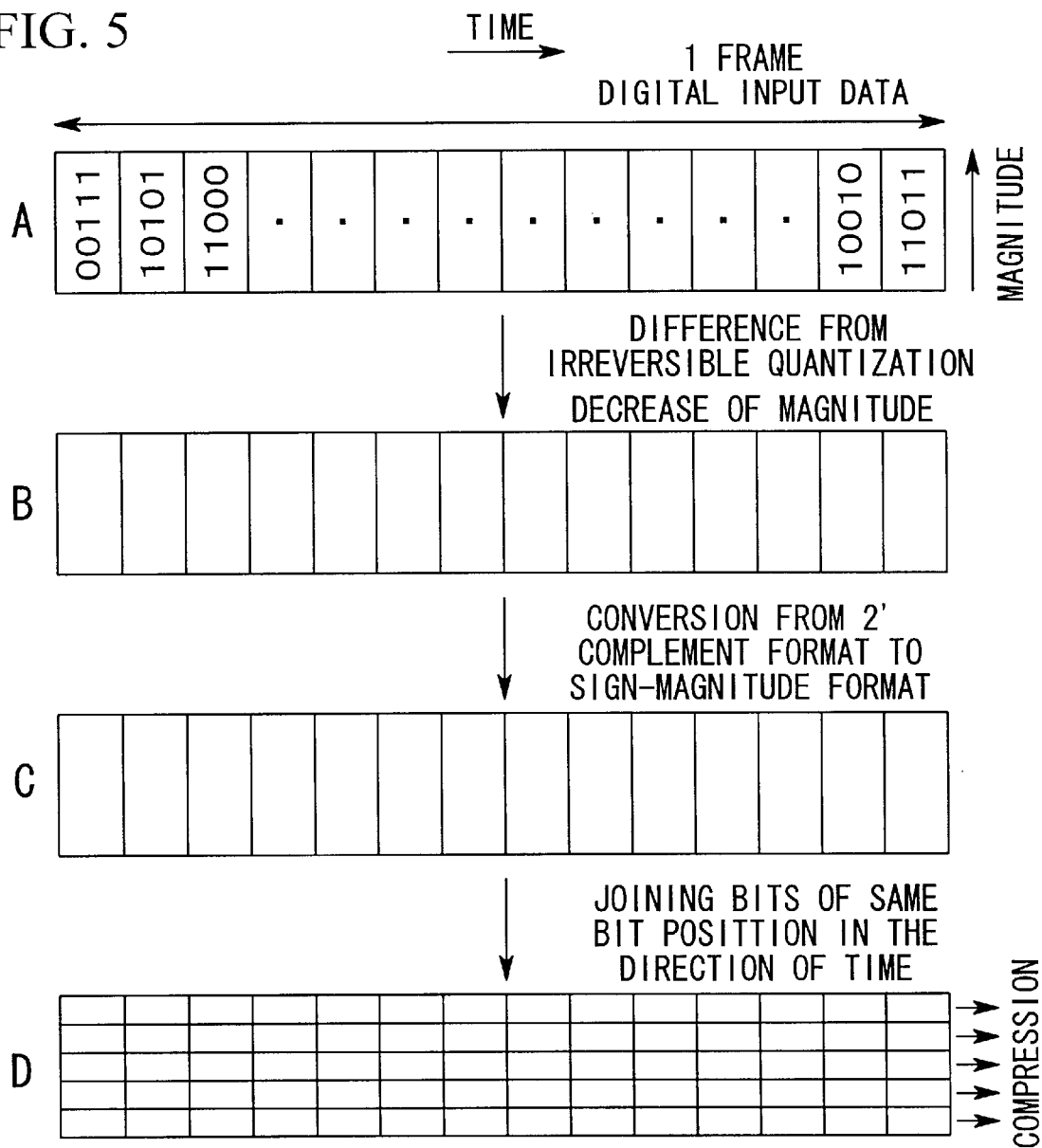
FIG. 5 is an illustration of an example of process performed by the reordering section 160 in Embodiment 2.

In this case, to increase the efficiency of reversible compression encoding carried out by the reversible encoding section 150, the reordering section 160 rearranges the order of the bits of the error signal (that is bitstream). Details of the process performed by the reordering section 160 will be explained below. FIG. 5 illustrates an example of process performed by the reordering section 160. In the digital input signals (refer to FIG. 5A), positive or negative integers are expressed by 2's complement format. FIG. 5B shows error signals between the digital input signal shown in FIG. 5A and the local reproduction signals corresponding to the digital input signals. The reordering section 160 converts the error signals (that is, bitstreams) from a bitstream expressed by the 2's complement format to a bitstream expressed by the sign-magnitude format (refer to FIG. 5C). Next, the reordering section 160 deblocks the converted error signals into individual bits. Lastly, the reordering section 160 joins each bit generated by the deblocking process for each bit positions (that is, MSB, 2-MSB, . . . , LSB), that is, in the horizontal direction of FIG. 5 (refer to FIG. 5D). FIG. 6 illustrates an example of the results (referred to as transformed error signals hereinbelow) output from the reordering section 160 in Embodiment 2. In FIG. 6, bitstreams in the horizontal direction (that is, a bitstream comprised by 1024 bits belonging to the same bit position) are referred to as horizontal bitstreams. In the reordering described above, the values of the error signals are not changed at all. However, because the magnitude of the error signals is small, it often happens that the output from the reordering section 160 shows all "0" in the highest bits, as illustrated in FIG. 6. The result is that, because the strings consist only of consecutive "0s", the efficiency of reversible compression encoding the error signals is increased. The reordering process described above represents a process of bit slicing the error signals (that is, vertical bit strings) in the horizontal direction.

Next, the reversible encoding section 150 performs reversible compression encoding of data output from the reordering section 160. Details of processing performed by the reverse encoding section 150 will be explained below.

First, the reversible encoding section 150 encodes horizontal bitstreams from MSB to j-MSB (for example, 4-MSB) individually by following the methods (1)~(4) outlined below.

(1) When all the 1024 bits comprising a horizontal bitstream is "0", this horizontal bitstream is coded "0".

(2) When one bit of the 1024 bits comprising a horizontal bitstream is "1", this horizontal bitstream is coded to a bitstream comprising at the end of "10" a bitstrem (assumed to be 10 bits, as an example) indicateing the bit position of "1".

(3) When two bits of the 1024 bits comprising a horizontal bitstream are "1", this horizontal bitstream is coded to a bitstream comprising at the end of "110" a bitstrem (assumed to be 10 bits×2, as an example) indicateing the bit position of "1".

(4) When more than three bits of the 1024 bits comprising a horizontal bitstream are "1", the horizontal bitstream is attached at the end of "111".

Also, the reversible encoding section 150 encodes individual horizontal bitstreams between (j+1)-MSB to LSB. In this case, the reversible encoding section 150 may encode each horizontal bitstream according to the methods outlines in (1)~(4), or after re-joining each error signals (that is, in the vertical direction in FIG. 6), each error signal may be encoded using other well known encoding methods.

According to the method of reversible compression encoding, it can be expected from the results shown in FIG. 6 that, even if there are many digital input signals containing 1 as the MSB, when the magnitude of the error signals corresponding to the digital input signals is reduced by 20 dB, there is hardly any "1s" in the MSB~3-MSB of the error signals. In such a case, by performing the reordering as described above, it is possible to reduce about 3/16 bits of the number of bits in the error signals, compared with the case of not performing the reordering process.

Further, the reversible encoding section 150 may use encoding methods other than those mentioned above, by using methods applicable to bitstreams containing consecutive sequences or sequences that appear frequently. An example is entropy encoding methods such as Huffman coding or arithmetic encoding. Also, compression efficiency can be improved by applying the universal encoding that enables reversible compression of text and the like to the output of the reordering section 160.

By carrying out the processes described above, the encoding apparatus shown in FIG. 4 can output irreversible compression codes I (n) from the irreversible quantization section 120 and reversible compression codes I (e) from the reversible encoding section 150.

In contrast, in the decoding apparatus shown in FIG. 4, the reversible decoding section 210 decodes the reversible compression codes I (e). Next, the reordering section 220 successively outputs error signals in units of frames by carrying out steps opposite to those carried out by the reordering section 160. And, the reverse quantization section 230 decodes irreversible compression codes I (n). Next, the adding section 240 adds the output from the reverse quantization section 230 and the output from the reordering section 220. Lastly, the frame synthesizing section 250 reproduces the original digital input signal sequence by successively joining the output of the adding section 240. By performing all of the processes mentioned above, the digital input signal sequence is output from the output terminal 260.

Figure 7:
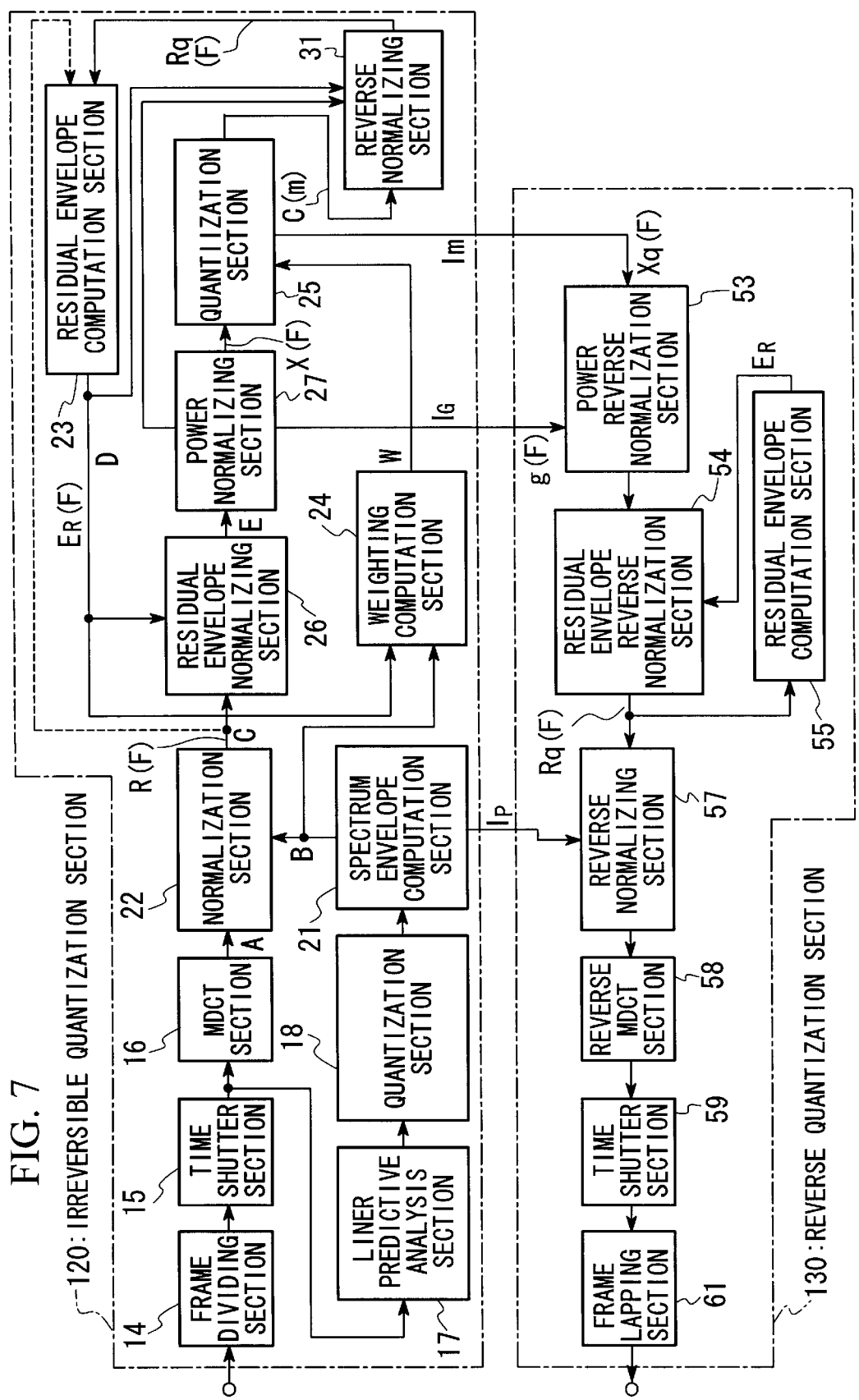
FIG. 7 is a block diagram of a specific example of the configuration of the irreversible quantization section 120 and the reverse quantization section 130 based on a transform encoding method.

The irreversible quantization section 120 in the encoding apparatus shown in FIG. 4 can be constructed using the transform encoding method, for example. The transform encoding method is disclosed in a Japanese Patent Application, First Publication, Hei 8-44399, for example. This example will be explained briefly using the diagram shown in FIG. 7. The frame dividing section 14, for each N samples, extract previous 2N samples from the output of the frame dividing section 110. The sequence comprised by the 2N samples are frames for processing by the LOT (lapped orthogonal transform) technique. The time shutter section 15 controls the window opening of the LOT processing frames. The output from the time shutter section 15, on the one end, is transformed by the N-th order Modified Discrete Cosine Transform (MDCT) section 16, which performs a type of LOT technique, into a modified discrete cosine coefficient in the frequency domain. The output from the time shutter section 15 is, at the other end, is analyzed by the linear predictive analysis section 17 to provide a linear prediction. The results are provided in the form of p-th order predictive coefficients $\alpha_0, \ldots, \alpha_P$. The quantization section 18 obtains an index $I_P$, which shows the spectrum envelope, by performing quantization after transforming the predictive coefficients $\alpha_0, \ldots, \alpha_P$ into LSP-parameter or k-parameter, for example. Here, spectrum envelope refers to a magnitude envelope of the MDCT coefficients.

The spectrum envelope computation section 21 obtains a spectrum envelope of the predictive coefficients $\alpha_0, \ldots, \alpha_P$. The normalization section 22 obtains a residual coefficient R(F) of the current frame F by dividing (that is, to normalize) the spectrum magnitude output from the MDCT section 16 by a spectrum envelope of a corresponding sample. Here, a residual coefficient refers to an MDCT coefficient flattened by a spectrum envelope. The weighting computation section 24 obtains weighting coefficients $W_1, \ldots, W_N$ (expressed by vector W) by multiplying the spectrum envelope output from the spectrum envelope computation section 21 with the envelope $E_R(F)$ of the residual coefficients output from the residual envelope computation section 23 for each corresponding sample. Here, an envelope of residual coefficient refers to an envelope resulting from performing further finer analysis of the residual coefficients plotted on the frequency axis. The weighting computation section 24 supplies weighting coefficients W to the quantization section 25.

The fine structure coefficients are obtained from the residual envelope normalizing section 26 by dividing (that is, to normalize) the residual coefficient R(F) of the current frame F output from the normalizing section 22 by the envelope of the residual coefficients output from the residual envelope computation section 23. Here, a fine structure coefficient refers to an MDCT coefficient obtained by further flattening the flattened MDCT coefficients with the envelope of residual coefficients. The power normalizing section 27 divides (that is, to normalize) the fine structure coefficients of the current frame F by a normalized gain g(F), which is a square root of an average value of their magnitude or power values, and supplies the result to the quantization section 25 as the normalized fine structure coefficient $X(F) = (X_1, \ldots, X_N)$. The power normalizing section 27 gives the normalized gain g(F) to the reverse normalizing section 31. And, the power normalizing section 27 quantizes the normalized gain g(F), and outputs the result as an Index $I_G$.

The quantization section 25 obtains a quantized minor sequence C(m) by weighting to a normalized fine structure coefficient X(F) using a weighting coefficient W, and by vector-quantizing the results. Here, the quantized minor sequence C(m) is an elemental sequence constructing M pieces of vectors $C(m^1), C(m^2), \ldots, C(m^M)$. The reverse normalizing section 31 reproduces quantized residual coefficient $R_q(F)$ by reverse normalizing the quantized minor sequence C(m) using the normalized gain g(F) supplied by the power normalization section 27, and by multiplying the result with the envelope of residual coefficient output from the residual envelope computation section 23. The residual envelope computation section 23 obtains an envelope of the quantized residual coefficients $R_q(F)$.

An index $I_P$ that indicates the quantization value of the linear predictive coefficient, an index $I_G$ that indicates the quantization value of the power-normalized gain of the fine structure coefficient and an index $I_m$ that indicates the quantization value of the fine structure coefficient are output from the irreversible quantization section 120 as irreversible compression codes I (n).

In the reverse quantization section 130, a normalized fine structure coefficient corresponding to the index $I_m$ and a normalized gain corresponding to the index $I_G$ are respectively input into the power reverse normalization section 53. The power reverse normalization section 53 obtains a fine structure coefficient by reverse normalizing of the normalized fine structure coefficient with the normalized gain. The residual envelope reverse normalization section 54 reproduces a residual coefficient $R_q(F)$ by multiplying (that is, reverse normalizing) a residual coefficient $E_R$ output from the residual envelope computation section 55 with a fine structure coefficient. The residual envelope computation section 55 computes an envelope of the reproduced residual coefficients $R_q(F)$ by using the same process as that performed by the residual envelope computation section 23 in the irreversible reverse quantization section 120.

In the meantime, the reverse normalization section 57 reproduces a frequency domain coefficient by multiplying (that is, reverse normalizing) a residual coefficient $R_q(F)$ output from the residual envelope reverse normalization section 54 with a spectrum envelope output from the spectrum envelope computation section 21. The reverse MDCT section 58 transforms the above frequency domain coefficients to time domain signals of the 2N samples (referred to as a reverse LOT processing frame hereinbelow) by performing Nth-order reverse discrete cosine transform for each frame. The time shutter section 59 applies a time shutter to the time domain signals for each frame. The frame lapping section 61 adds the N samples in the first half of a current frame and the N samples in the latter half of a preceding frame of the output data (reverse LOT processing frames of 2N samples) from the time shutter section 59, and the resulting N samples are output to the subtraction section 140 as the reverse quantization signal of the current frame.

An example of the irreversible quantization section 120 having a device structure to divide the data in the frequency domain to produce hierarchical coding will be explained with reference to FIG. 8. This structure is disclosed in a Japanese Patent, First Publication, Hei 8-263096. At the original sound input signal 21 from the frame dividing section 110, the highest frequency is $f_4$ and the sampling frequency is $2f_4$. As the #1 (that is, first) band selection means, a #1 sampling rate converter 221 extracts first band signal 23₁ having a highest frequency $f_1$ and the sampling frequency $2f_1$ (where $f_1 < f_2 < f_3 < f_4$) from the original sound input signal 21. The #1 encoder 24₁ encodes #1 band signal 23₁ to a #1 code $C_1$. The #1 decoder 25₁ decodes the #1 code $C_1$ to a decoded signal 12₁ having the highest frequency $f_1$ and a sampling frequency $2f_1$. The #1 sampling rate converter 26₁ converts the decoded signal 12₁ to a #1 transform decoded signal having the highest frequency $f_2$ and sampling frequency $2f_2$. In the meantime, the sampling rate converter 22₂ serving as the #2 (that is, second) band selection device extracts a #2 band signal 23₂ having a highest frequency $f_2$ and a sampling frequency $2f_2$ from the original sound input signal 21. The #2 differential circuit 28₂ obtains a #2 differential signal 29₂ by subtracting the #1 transform decoded signal from the #2 band signal 23₂. The #2 encoder 24₂ encodes the #2 differential signal 29₂ to a #2 code $C_2$.

In the subsequent steps, the same processing is carried out. In this case, the process of obtaining the #3 (that is, third) code $C_3$ will be explained for the case of i=3 (where i=2, 3, ..., n, in this example to i=4 only). The #i-1 (#2) decoder $25_{i-1}$ (represented by $25_2$ in FIG. 8) decodes the #i-1 (#2) code $C_{i-1}$ ($C_2$) to an #i-1 (#2) decoded signal having a highest frequency $f_{i-1}$ ($f_2$) and a sampling frequency $2f_{i-1}$ ($2f_2$). The adder $60_{i-1}$ ($60_2$) obtains an #i-1 (#2) sum signal by adding the #i-1 (#2) decoded signal and the #i-2 (#1) transform decoded signal. The #i-1 (#2) sampling rate converter $26_{i-1}$ ($26_2$) converts the #i-1 (#2) sum signal to an #i-1 (#2) transform decoded signal having a highest frequency $f_i$ ($f_3$) and a sampling frequency $2f_i$ ($2f_3$). In the meantime, the sampling rate converter $22_i$ serving as the #i (#3) band selection means extracts an #i (#3) band signal $23_i$ ($23_3$) having highest frequency $f_i$ ($f_3$) and the sampling frequency $2f_i$ ($2f_3$) from the original sound input signal 21. The #i (#3) differential circuit $28_i$ ($28_3$) obtains an #i (#3) band (#3) differential signal $29_3$ by subtracting the #i-1 (#2) transform decoded signal from the #i (#3) band signal $23_i$ ($23_3$). The #i (#3) encoder $24_i$ ($24_3$) encodes the #i (#3) differential signal $29_3$ to an #i (#3) code $C_i$ ($C_3$). Here, the #i-1 (#2) decoder $25_{i-1}$ ($25_2$), the adder $60_{i-1}$ ($60_2$) and the #i-1 (#2) sampling rate converter $26_{i-1}$ ($26_2$) constitute the #i-1 (#2) decoding means $40_{i-1}$ ($40_2$). However, in the #1 decoding means $40_1$, the #i-2 layer does not exit so that the adder $60_0$ is omitted. Also, the band signal of the uppermost layer, which is #i+1 (#4) band signal $23_4$ is a signal having the highest frequency signal $f_4$ so that the sampling rate converter $22_4$ serving as the #i+1 band selection means is omitted.

Figure 8:
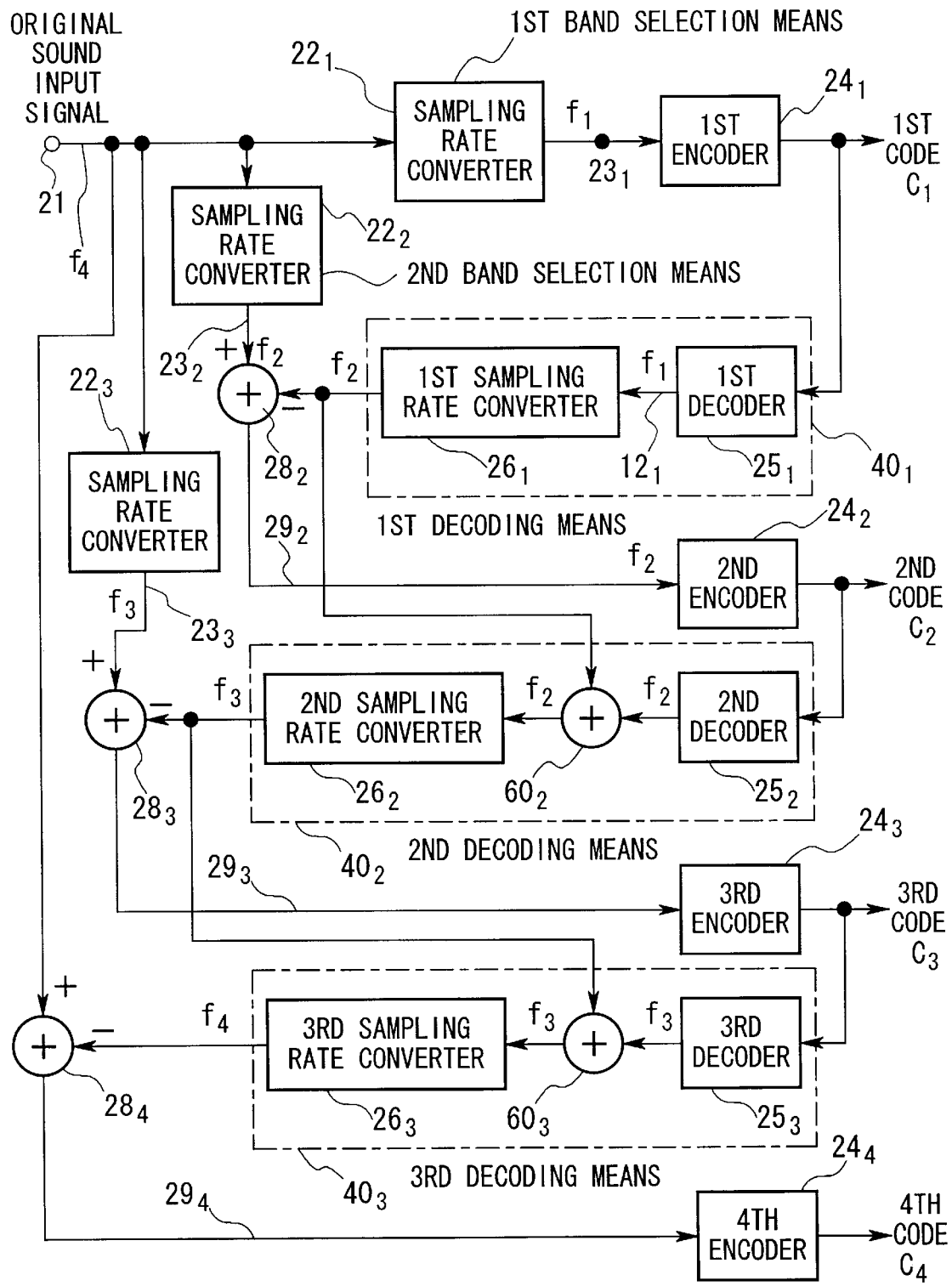
FIG. 8 is a block diagram of a specific example of the configuration of the irreversible quantization section 120 based on hierarchical encoding method.

The irreversible quantization section 120 shown in FIG. 8 can be used to divide the input signal band into n-divisions for encoding. The #1~#n (#4) codes $C_1$~$C_n$ ($C_4$) are multiplexed for each frame in the multiplexing circuit, and are then output as irreversible codes P(n). In this case, the multiplexing circuit is constructed so that one of the #1~#i codes are selected and output. The i-encoder $24_i$ (i=1~n: however in FIG. 8, n=4) should be set such that as i increases, the compression efficiency becomes smaller so as to enable to provide wide-band high quality encoding. If such a condition can be fulfilled, encoding method used in the above encoders may all be the transform encoding method, for example.

Figure 9:
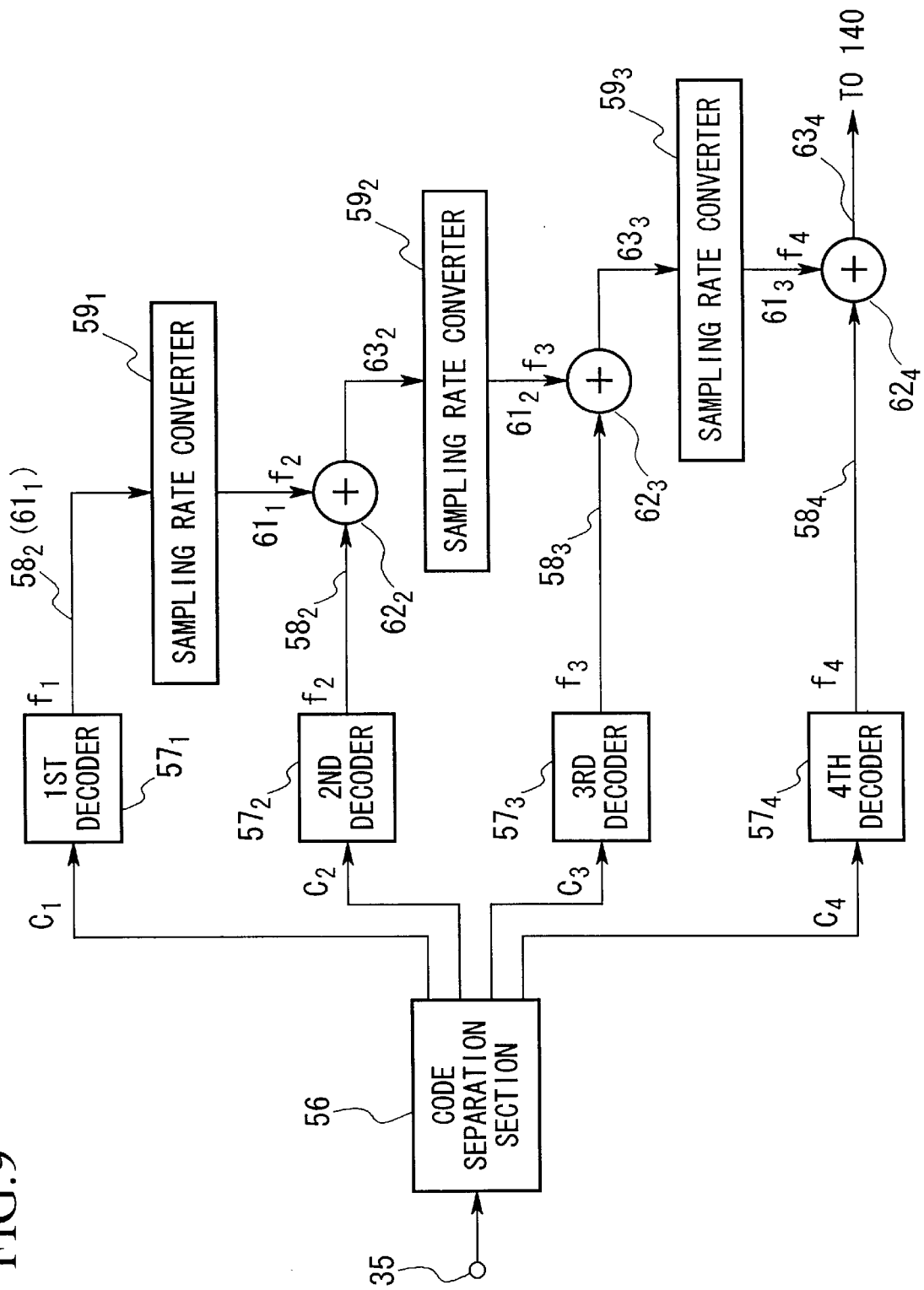
FIG. 9 is a block diagram of a specific example of the configuration of the reverse quantization section 130 corresponding to the irreversible quantization section 120 shown in FIG. 8.

The CELP encoding method and transform encoding method can be used in the 1~n encoders $24_1$~$24_4$, and the 1~n encoders $24_1$~$24_4$ may use the same or different encoding methods. The outline of the reverse quantization section 130 used with the irreversible quantization section 120 shown in FIG. 8 will be explained with reference to FIG. 9. FIG. 9 shows a case of n=4, that is, when the code sequence C is comprised by #1~4 codes $C_1$~$C_4$. The code separation means 56 separates the code sequence C into #1~4 codes $C_1$~$C_4$. Then, the #1 code $C_1$ is supplied to the #1 decoder $57_1$, #2 code $C_2$ to the #2 decoder $57_2$, #3 code $C_3$ to the #3 decoder $57_3$, and #4 (that is, fourth) code $C_4$ to the #4 decoder $57_4$. The #1 decoder $57_1$ decodes #1 code $C_1$ to #1 decoder signal $58_1$. The #1 decode signal $58_1$ is input in the #1 sampling rate converter $59_1$ as the #1 decoded output $63_1$. The #1 sampling rate converter $59_1$ converts #1 decoded output $63_1$ to #1 transform decoded signal $61_1$ at the sampling frequency $2f_2$. In the meantime, the #2 decoder $57_2$ decodes the #2 code $C_2$ into #2 decoded signal $58_2$. The #2 adder $62_2$ adds #1 transform decoded signal $61_1$ and #2 decoded signal $58_2$ to obtain #2 decoded output $63_2$. The #2 sampling rate converter $59_2$ converts the #2 decoded output $63_2$ to #2 transform decoded signal $61_2$ at the sampling frequency $2f_3$. In the following, explanation is provided for a general case of i=3. The #i (#3) decoder $57_i$ ($57_3$) decodes #i (#3) code $C_i$ ($C_3$) to #i (#3) decoded signal $58_i$ ($58_3$). The #i (#3) adder $62_i$ ($62_3$) adds #i-1 (#2) transform decoded signal $61_{i-1}$ and #i (#3) decoded signal $58_i$ ($58_3$) to obtain #i (#3) decoded output $63_i$ ($63_3$). The #i (#3) sampling rate converter $59_i$ ($59_3$) converts the #i (#3) decoded output $63_i$ ($63_3$) to #i (#3) transform decoded signal $61_i$ ($61_3$) at the sampling frequency $2f_{i+1}$ ($2f_4$). The #i+1 (#4) decoder $57_{i+1}$ ($57_4$) decodes the #i+1 (#4) code $C_{i+1}$ ($C_4$) to i+1 (#4) decoded signal $58_{i+1}$ ($58_4$). The #i+1 (#4) addder $62_{i+1}$ ($62_4$) adds #i (#3) transform decoder $61_i$ ($61_3$) and #i+1 (#4) decoder signal $58_{i+1}$ ($58_4$) to obtain i+1 (#4) decoded output $63_{i-1}$ ($63_4$). The i+1 (#4) decoded output $63_{i+1}$ ($63_4$) is supplied to the subtraction section 140 as a quantized signal.

Next, the experimental results in Embodiment 2 will be explained with reference to the tables presented in FIGS. 10 and 11. Tests were carried out for three different stereo signals sampled at 44.1 KHz and three different monaural signals sampled at 16 KHz. In the irreversible quantization section 120, processed data were compliant to a transform domain Weighted INterleave Vector Quantization (Twin VQ) having an ISO/IEC MPEG-4 scalable profile. The unit compression bitrate in the irreversible quantization section 120 was 16 Kbit/s/ch for 44.1 KHz and 8 Kbit/s for 16 KHz. This qantizer was used repeatedly so as to minimize the sum of the data rates of the MPEG compression signals and error signals. As a result, the quantization bitrate was reduced to 1/44 of the original signals for 44.1 KHz and to 1/32 for 16 KHz. The percentage of total file size is a sum of the file size of the error signals and the size of the compression MPEG bitstreams. The total file sizes shown in FIGS. 10 and 11 show that the data can be reduced to 50~70% of the original signals. It can be seen that when the original file size is compressed to about 1/10 in the irreversible quantization section 120, the total file size is at its minimum. Also, the compression efficiency is slightly better in the 44.1 KHz stereo data than in the 16 KHz monaural data.

§3. Embodiment 3

Figure 12:
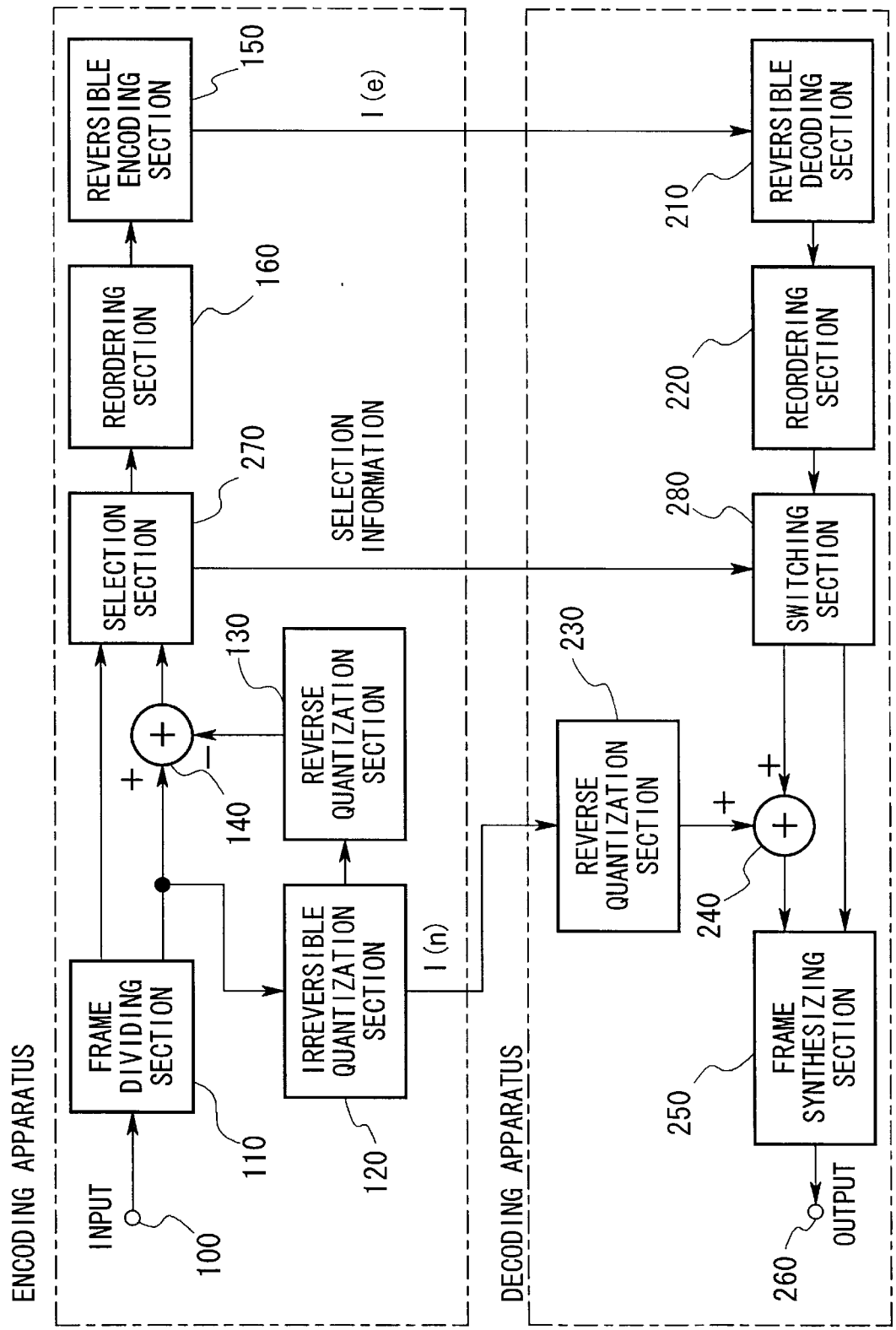
FIG. 12 is a block diagram of an example of the configuration of the encoding and decoding apparatuses in Embodiment 3 of the present invention.

FIG. 12 shows a block diagram of the structure of the encoding and decoding apparatus in Embodiment 3. In FIG. 12, those parts that correspond to those in FIGS. 1 and 4 are given the same reference numerals, and their explanations are omitted. The apparatus shown in FIG. 12 can be switched to a configuration equivalent to that shown in Embodiment 1 (refer to FIG. 1) or to a configuration equivalent to that shown in Embodiment 2 (refer to FIG. 4), by using the selection section 270 and the switching section 280.

That is, in the encoding apparatus, digital input signals are input into the selection section 270 from the frame dividing section 110 in units of frames and the error signals to correspond with the digital input signals are input into the selection section 270 from the subtraction section 140 in units of frames. The selection section 270 selects and outputs either digital input signals or error signals in units of frames. Also, the selection section 270 generates selection information to show whether the output data of the selection section 270 are digital input signals or error signals for each output (that is, for each frame) and attaches the selection information to the output data. The selection information may not be attached to the output data of the selection section 270, but may be forwarded separately to the switching section 280 by synchronizing with the output of the selection section 270. Subsequently, the output data from the selection section 270 are processed by the steps explained in Embodiments 1 and 2 (that is, reordering→irreversible encodinge→reverse decoding→reverse reordering). The result is that identical signals to the output signals from the selection section 270 are output from the reordering section 220 in units of frames.

In the meantime, in the decoding apparatus, the switching section 280 extracts selection information from the output of the reordering section 220. Here, the selection information may be received from the selection section 270 in synchronization with the output of the reordering section 220. And, if the selection information indicates that the output from the reordering section 220 is a digital input signal, the switching section 280 sends the output as it is to the frame synthesizing section 250. The output from the switching section 280 in the subsequent steps are the same as those performed in Embodiment 1 (frame synthesis→reproduced signal output). If, on the other hand, it is indicated that the output from the reordering section 220 is error signal, the output from the switching section 280 is sent to the frame adding section 240. The output from the switching section 280 in the subsequent steps are the same as those explained in Embodiment 2 (adding to output from the reverse quantization section 230→frame synthesis→reproduced signal output).

§4. Embodiment 4

Before explaining Embodiment 4, the topics to be resolved in this embodiment will be explained. In the irreversible compression sections presented in Embodiments 2, 3 (that is, irreversible quantization section 120, reverse quantization section 130, reverse quantization section 230), known compression formats and decoders are sometimes used in their original forms. However, in such cases, if the encoding apparatus and decoding apparatus are operated on different platforms, local reproduction signal (that is, the output of the reverse quantization section 130) used for error signal generation and the actual reverse quantization signal (that is, the output of the reverse quantization section 230) may not match perfectly. For example, using the MPEG audio standard specification as an example, for 16-bit digital input signals, the difference between the standard reference signal for use in mutual connectability testing of an encoder and a decoder and the actual output signal from the decoder is guaranteed to be within "±1" (that is, about the size of error due to mismatching of LSB), but the output data do not necessarily show perfect matching. When the output from the reverse quantization section 130 and the output from the reverse quantization section 230 are not matching, even if the error signal produced according to the output from the reverse quantization section 130 is added (in the adding section 240) to the output from the reverse quantization section 230, it is not certain that lossless reproduction of the original digital input signal will be achieved.

Therefore, in Embodiment 4, the absolute portion of the magnitude of the digital input signal is arithmetic shifted higher by an amount equal to a number of bit positions (t-bit positions assumed) based on the difference between the output data of the reverse quantization section 130 and the reverse quantization section 230, and the arithmetic shifted digital input signals are irreversible quantized. And, after the irreversible quantized digital input signals are reverse quantized in (either the reverse quantization section 130 or the reverse quantization section 230), the absolute portion of the magnitude of the reverse quantized signals is arithmetic shifted t-bit positions lower (that is, the absolute portion is divided by $2^t$). By so doing, the output data from the reverse quantization section 130 show matching to the output data from the reverse quantization section 230.

In the case of the MPEG audio encoding, output of the reverse quantization section 130 and the output of the reverse quantization section 230 contain an error of ±1 each, compared with the original digital input signals. Therefore, when the difference between the output of reverse quantization section 130 and the output of reverse quantization section 230 is, in case of "+1" for one side and "−1" for the other, will be the maximum value "±2". For this reason, in this embodiment, to remove such a maximum value from the digital input signal, t=3 is selected, and the digital input signal is arithmetic shifted by 3-bits. And, although it is obvious, the value of t is not limited to 3, it is determined by the difference between the output data from the reverse quantization section 130 and the reverse quantization section 230, as described above.

Figure 13:
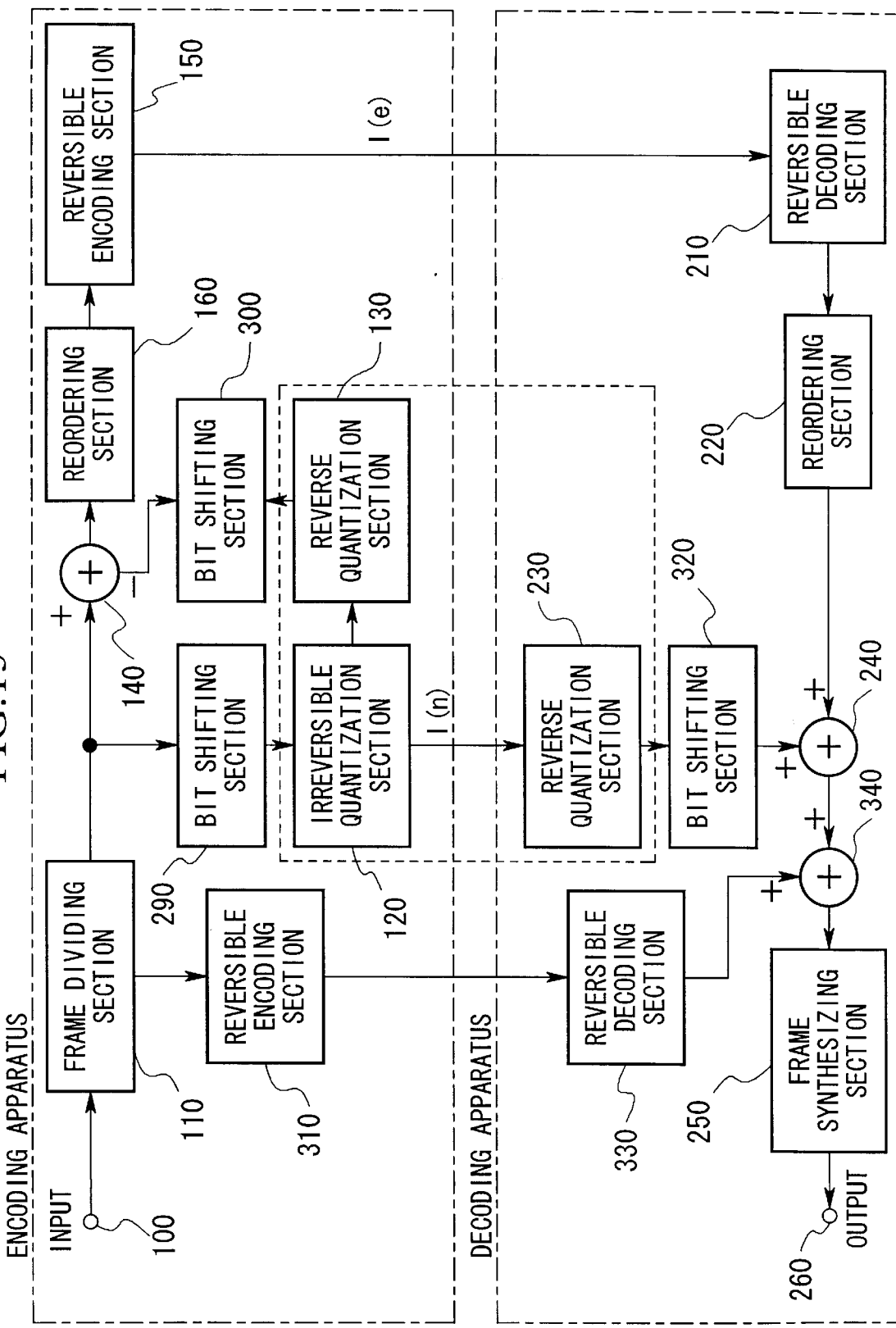
FIG. 13 is a block diagram of an example of the configuration of the encoding and decoding apparatuses in Embodiment 4 of the present invention.

FIG. 13 shows a block diagram of the device structure of the encoding and decoding apparatus in Embodiment 4. In FIG. 13, those parts that correspond to those in FIGS. 1, 4, 12 are given the same reference numerals, and their explanations are omitted.

Further, in FIG. 13, digital input signals to the frame dividing section 110, reproduced signals from the frame synthesizing section 250, and the signals processed in the irreversible quantization section 120, reverse quantization section 130, and the reverse quantization section 230, are expressed by the 2's complement format, and other signals are expressed by the sign-magnitude format. Therefore, it is assumed that conversion from the 2's complement format to the sign-magnitude format and vice versa are assumed to be carried out as appropriate.

In the encoding apparatus shown in FIG. 13, first, the frame dividing section 110 successively divides digital input signals sequence into units of frames. The bit shifting section 290 arithmetic shifts t-bit position higher the absolute value portion of the magnitude of the digital input signals, and the lower t-bits of the absolute value portion is made "0". The irreversible quantization section 120 performs irreversible compression encoding of the output of the bit shifting section 290. The reverse quantization section 130 produces local reproduction signal by performing reverse quantization of the output of the reverse quantization section 120. After the bit shifting section 300 rounds off the lower t-bits of the absolute value portion of the magnitude of the local reproduction signals, the bits are arithmetic shifted lower t-bit positions. The subtraction section 140 obtains the error signal between the output of the frame dividing section 110 and the output of the bit shifting section 300. The subsequent steps of processing of error signal by the reordering section 160 and reversible encoding section 150 are the same as those in the reordering section 160 and reversible encoding section 150 in Embodiment 2. By so doing, the reversible encoding section 150 outputs reversible compression codes of the error signals.

In the meantime, the reversible encoding section 310 performs reversible compression encoding of the upper t-bits of the absolute value portion of the magnitude of the digital input signal. Because a digital input signal is expressed by the sign-magnitude format, the higher t-bits are often "0". Therefore, the reversible encoding section 310 can increase compression efficiency by performing the same encoding process as the reversible encoding section 150.

By carrying out the process described above, the encoding apparatus shown in FIG. 13 outputs irreversible compression codes from the irreversible quantization section 120, reversible compression codes (of the error signal) from the reversible encoding section 150, and reversible compression codes (of the upper t-bits of the digital input signal) from the reversible encoding section 310.

In contrast, in the decoding apparatus shown in FIG. 13, reversible decoding section 210 and the reordering section 220 provide the same processing as those provided by the reversible decoding section 210 and reordering section 220 in Embodiment 2 to the reversible compression codes (of the error signals) from the reversible encoding section 150. In the meantime, the reversible quantization section 230 generates local reproduction signals by performing reverse quantization of the output of the irreversible quantization section 120. After the bit shifting section 320 rounds off the lower t-bits of the absolute value portion of the magnitude of the local reproduction signals, the bits are arithmetic shifted lower t-bit positions. The adding section 240 adds the output of the reordering section 220 and the output of the bit shifting section 320.

In the meantime, by reverse decoding the output of the reversible encoding section 310, the reversible decoding section 330 outputs the upper t-bits of the absolute value portion of the magnitude of the original input signals in units of frames. The adding section 340 joins the output of the reversible decoding section 330 to the high bit side of the output of the adding section 240. Lastly, the frame synthesizing section 250 successively joins the output data of the adding section 340 to reproduce the original digital input signal sequence. By performing the steps described above, the original digital input signal sequence is output from the output terminal 260.

§5. Supplement

The functions of each section demonstrated in the embodiments described above may be performed by computer means executing appropriate application programs.

Also, the apparatuses shown in FIGS. 4, 12 and 13 have only one type of irreversible quantization means (that is, has respective irreversible quantization section 120, reverse quantization section 130 and reverse quantization section 230), but the present apparatus is not limited to this particular arrangement. The present apparatus may be provided with a plurality of irreversible quantization methods and a plurality of irreversible quantization conditions so that optimum methods and conditions may be incorporated (for example, reverse quantization methods and conditions that decoding units are capable of executing) and selected as appropriate (for example, in units of frames). In such an apparatus, it may be considered that the information indicating the selected method and conditions may be attached to the selection information to be sent to the decoding unit.

What is claimed is:

1. An encoding method for encoding a digital signal for each frame which comprises a plurality of samples in a sign-magnitude format, said method comprising:
    a step for reversible encoding a bitstream of said digital signal which comprises bits over samples for each of bit positions within a frame to a reversible compression code;
    wherein said bitstream is encoded to a corresponding predetermined code from the most significant bit position to a jth bit position, said j being a predetermined integer, and
    when all bits in said bitstream are "0", encoding to a predetermined code which indicates that all bits in said bitstream are zero, as said corresponding predetermined code.

2. A recording medium which records a program for executing an encoding method according to claim 1.

3. An encoding method for encoding a digital signal for each frame which comprises a plurality of samples in a sign-magnitude format, said method comprising:
    a step for reversible encoding a bitstream of said digital signal which comprises bits over samples for each of bit positions within a frame to a reversible compression code;
    wherein said bitstream is encoded to a corresponding predetermined code from the most significant bit position to a jth bit position, said j being a predetermined integer, and
    when m bits of said bitstream are "1", encoding to a predetermined code which indicates that at least bit positions of said m bits are "1".

4. A recording medium which records a program for executing an encoding method according to claim 3.

5. A decoding method comprising:
    a step for reconstructing a digital signal for each frame which comprises a plurality of samples in a sign-magnitude format by reversible decoding of a reversible compression code into a bitstream which comprises bits over samples for each of bit positions within a frame,
    wherein said reversible compression code is decoded to a corresponding predetermined bitstream from the most significant bit position to a jth bit position, said j being a predetermined integer, and
    when said reversible compression code indicates that all bits in said bitstream are "0", reconstructing a bitstream in which all bits are "0" as said corresponding predetermined bitstream.

6. A recording medium which records a program for executing a decoding method according to claim 5.

7. A decoding method comprising:
    a step for reconstructing a digital signal for each frame which comprises a plurality of samples in a sign-magnitude format by reversible decoding of a reversible compression code into a bitstream which comprises bits over samples for each of bit positions within a frame,
    wherein said reversible compression code is decoded to a corresponding predetermined bitstream from the most significant bit position to a jth bit position, said j being a predetermined integer, and
    when said reversible compression code indicates bit positions of m bits which are "1", reconstructing a bitstream in which m bits indicated by said bit positions are "1" and the other bits are "0".

8. A recording medium which records a program for executing a decoding method according to claim 7.

9. An encoding method for encoding a digital signal for each frame comprising a plurality of samples expressed in sign-magnitude format, comprising:
    a step for reversible encoding a bitstream within a frame over samples in said error signal;
    a step for reconstructing a local reconstructed signal for said irreversible compression code;
    a step for obtaining an error signal between said local reconstructed signal and said digital signals; and
    a step for generating a reversible compression code by reversible encoding a bitstream within a frame over samples in said error signals;
    wherein when reversible encoding said bitstream, said bitstream is encoded to a reversible compression code corresponding to the bitstream for each bit position from the most significant bit position to a jth position, said j being a predetermined integer.

10. An encoding method according to claim 9, wherein one irreversible quantization method from among a plurality of irreversible quantization methods is selected, irreversible quantization is performed using the selected method, and selective information indicating said selected method is output.

11. An encoding method according to claim 10, wherein said irreversible quantization is performed by a transform encoding method.

12. A recording medium which records a program for executing an encoding method according to claim 9.

13. A decoding method comprising:
a step for reconstructing an error signal for each frame comprising a plurality of samples in a sign-magnitude format by reversible decoding of a reversible compression code; and
a step for reconstructing a local reconstructed signal by irreversible decoding of an irreversible compression code;
a step for generating a digital signal by adding said error signal and said local reconstructed signal,
wherein when restoring the error signal, a bitstream of the error signal is restored for each bit position from the most significant bit position to a jth bit position, said j being a predetermined integer.

14. A decoding method according to claim 13, wherein when decoding said irreversible compression code, reverse quantization is performed using an reverse quantization method selected from among a plurality of reverse quantization methods according to selective information which is input.

15. A decoding method according to claim 14, wherein said reverse quantization is performed by a transform decoding method.

16. A recording medium which records a program for executing a decoding method according to claim 13.

17. An encoding method for encoding a digital signal for each frame comprising a plurality of samples in a sign-magnitude format comprising:
a step for generating an irreversible compression code for said digital signal;
a step for reconstructing a local reconstructed signal for said irreversible compression code;
a step for selecting either an error signal between said local reconstructed signal and said digital signal, or said digital signal;
a step for generating selective information indicating whether said error signal or said digital signal is selected; and
a step for generating a reversible compression code by reversible encoding of a bitstream within a frame over samples in said selected signal,
wherein when reversible encoding said bitstream, said bitstream is encoded to said reversible compression code corresponding to the bitstream for each bit position from the most significant bit position to a jth position, said j being a predetermined integer.

18. A recording medium which records a program for executing an encoding method according to claim 17.

19. A decoding method comprising:
reconstructing a reconstructed signal for each frame comprising a plurality of samples in a sign-magnitude format by decoding a reversible compression code into a bitstream comprising bits within a frame over samples for each bit position from the most significant bit position to a jth bit position, said j being a predetermined integer;
if selective information indicates that a digital signal is selected, said reconstructed signal is output as digital signal; and
if selective information indicates that an error signal is reversibly quantized, reconstructing a local reconstructed signal for an irreversible compression code, and generating a digital signal by adding said reconstructed signal and said local reconstructed signal.

20. A recording medium which records a program executing a decoding method according to claim 19.

21. An encoding method for encoding a digital signal for each frame comprising a plurality of samples in a sign-magnitude format, comprising:
a step for generating a reversible compression code by reversible encoding of the most significant t-bit of absolute amplitude values of said digital signal;
a step for generating an irreversible compression code by irreversible encoding of a signal which is obtained by arithmetically t-bit upward shifting of the absolute amplitude values of said digital signal;
a step of reconstructing a local reconstructed signal for said irreversible compression code;
a step for obtaining an error signal between said digital signal and a signal which is obtained by arithmetically t-bit downward shifting of said local reconstructed signal; and
a step for encoding of a bitstream comprising bits within a frame over samples to a code corresponding to the bitstream for each bit position from the most significant bit position to a jth bit position, said j being a predetermined integer.

22. A recording medium which records a program for executing an encoding method according to claim 21.

23. A decoding method comprising:
restoring an error signal for each frame comprising a plurality of samples in sign-magnitude format by decoding a reversible compression code into a bitstream comprising bits within a frame over samples corresponding to said reversible compression code for each bit position from the most significant bit position to a jth bit position, said j being a predetermined integer;
restoring a local reconstruction signal by decoding an irreversible compression code;
a step for generating bits for bit positions other than the most significant t-bit positions of absolute amplitude values by adding said error signal and a signal which is obtained by arithmetically t-bit downward shifting of said local reconstructed signal;
a step for reconstructing bits for said most significant t-bit positions by reversible decoding of a reversible compression code; and
a step for generating a digital signal by adding bits for said most significant t-bit positions and said bits for bit positions other than said most significant t-bit positions.

24. A recording medium which records a program for executing a decoding method according to claim 23.

25. An encoding apparatus for encoding a digital signal for each frame which comprises a plurality of samples in a sign-magnitude format, comprising:
means for reversible encoding a bitstream of said digital signal which comprises bits over samples for each of bit positions within a frame to a reversible compression code;
wherein said bitstream is encoded to a corresponding predetermined code from the most significant bit position to a jth bit position, said j being a predetermined integer, and
when all bits in said bitstream are "0", encoding to a predetermined code which indicates that all bits in said bitstream are zero, as said corresponding predetermined code.

26. An encoding apparatus for encoding a digital signal for each frame which comprises a plurality of samples in a sign-magnitude format, comprising:

means for reversible encoding a bitstream of said digital signal which comprises bits over samples for each of bit positions within a frame to a reversible compression code;

wherein said bitstream is encoded to a corresponding predetermined code from the most significant bit position to a jth bit position, said j being a predetermined integer, and when m bits of said bitstream are "1", encoding to a predetermined code which indicates that at least bit positions of said m bits are "1".

27. A decoding apparatus comprising:

means for reconstructing a digital signal for each frame which comprises a plurality of samples in a sign-magnitude format by reversible decoding of a reversible compression code into a bitstream which comprises bits over samples for each of bit positions within a frame, when said reversible compression code indicates that all bits in said bitstream are "0", reconstructing a bitstream in which all bits are "0" as said corresponding predetermined bitstream.

28. A decoding apparatus comprising:

means for reconstructing a digital signal for each frame which comprises a plurality of samples in a sign-magnitude format by reversible decoding of a reversible compression code into a bitstream which comprises bits over samples for each of bit positions within a frame, wherein said reversible compression code is decoded to a corresponding predetermined bitstream from the most significant bit position to the jth bit position, said j being a predetermined integer, when said reversible compression code indicates bit positions of m bits which are "1", reconstructing a bitstream in which m bits indicated by said bit positions are "1" and the other bits are "0".

29. An encoding apparatus for encoding a digital signal for each frame comprising a plurality of samples expressed in sign-magnitude format, comprising:

means for irreversible encoding of said digital signal to an irreversible compression code;

means for reconstructing a local reconstructed signal for said irreversible compression code;

means for obtaining an error signal between said local reconstructed signal and said digital signal; and means for reversible encoding of a bitstream comprising bits within a frame over samples in said error signal;

wherein when reversible encoding said bitstream, said bitstream is encoded to a reversible compression code corresponding to the bitstream for each bit position from the most significant bit position to a jth position, said j being a predetermined integer.

30. An encoding apparatus according to claim 29 wherein, one irreversible quantization method from among a plurality of irreversible quantization methods is selected, irreversible quantization is performed using the selected method, and selective information indicating said selected method is output.

31. An encoding apparatus according to claim 30, wherein said irreversible quantization is performed by a transform encoding method.

32. A decoding apparatus comprising:

means for reconstructing an error signal for each frame comprising a plurality of samples in a sign-magnitude format by reversible decoding of a reversible compression code; and means for generating a digital signal by adding said error signal and said local reconstructed signal, wherein when restoring the error signal, the means for reconstructing an error signal restores a bitstream of the error signal for each bit position from the most significant bit position to a jth bit position, said j being a predetermined integer.

33. A decoding apparatus according to claim 32, wherein reverse quantization is performed by a transform decoding method.

34. A decoding apparatus according to claim 33, wherein said reverse quantization is performed by a transform decoding method.

35. An encoding apparatus for encoding a digital signal for each frame comprising a plurality of samples in sign-magnitude format, comprising:

means for generating an irreversible compression code for said digital signal, means for reconstructing a local reconstructed signal for an irreversible compression code, means for selecting of either an error signal between said local reconstructed signal and said digital signal, or said digital signal, means for generating selective information indicating whether said error signal or said digital signal is selected, and means for generating a reversible compression code by reversible encoding a bitstream within a frame over samples in said error signal;

wherein when reversible encoding said bitstream, said bitstream is encoded to a reversible compression code corresponding to the bitstream for each bit position from the most significant bit position to a jth position, said j being a predetermined integer.

36. A decoding apparatus comprising:

means for reconstructing a reconstructed signal for each frame comprising a plurality of samples in a sign-magnitude format by decoding a reversible compression code into a bitstream comprising bits within a frame over samples for each bit position from the most significant bit position to a jth bit position, said j being a predetermined integer;

if selective information indicates that a digital signal is selected, said reconstructed signal is output as said digital signal, and if selective information indicates that an error signal has been reversibly quantized, reconstructing a local reconstructed signal for an irreversible compression code, and generating a digital signal by adding said reconstructed signal and said local reconstructed signal.

37. An encoding apparatus for encoding a digital signal for each frame comprising a plurality of samples in sign-magnitude format, comprising:

means for generating a reversible compression code by reversible encoding of the most significant t-bit of absolute amplitude values of said digital signal;

means for generating an irreversible compression code by irreversible encoding of a signal which is obtained by arithmetically t-bit upward shifting of the absolute amplitude values of said digital signal;

means for reconstructing a local reconstructed signal for said irreversible compression code;

means for obtaining an error signal between said digital signal and a signal which is obtained by arithmetically t-bit downward shifting of said local reconstructed signal; and means for encoding a bitstream of said error signal comprising bits within a frame over the samples to a code corresponding to the bitstream for each bit position from the most significant bit position to a jth bit position, said j being a predetermined integer.

38. A decoding apparatus comprising:

means for reconstructing an error signal for each frame comprising a plurality of samples in a sign-magnitude format by decoding a reversible compression code into a bitstream comprising bits within a frame over samples corresponding to said reversible compression code for each bit position from the most significant bit position to a jth bit position, said j being a predetermined integer;

means for reconstructing a local reconstructed signal by decoding an irreversible compression code;

means for generating bits for bit positions other than the most significant t-bit positions of absolute amplitude values by adding said error signal and a signal which is obtained by arithmetically t-bit downward shifting of said local reconstructed signal;

means for reconstructing bits for said most significant t-bit positions by reversible decoding of a reversible compression code; and means for generating a digital signal by adding bits for said most significant t-bit positions and said bits for bit positions other than said most significant t-bit positions.

\* \* \* \* \*